United States Patent
Ayeb et al.

(10) Patent No.: US 10,804,688 B2
(45) Date of Patent: Oct. 13, 2020

(54) ARC DETECTION BASED ON VARIANCE OF CURRENT FLOW

(71) Applicant: Littelfuse, Inc., Chicago, IL (US)

(72) Inventors: Mohamed Ayeb, Kassel (DE); Ludwig Brabetz, Lehre (DE); Leonard Gysen, Bad Arolsen (DE); Markus Horn, Melsungen (DE); Tobias Kerner, Braunschweig (DE); Carsten Fock, Bremen (DE)

(73) Assignee: Littelfuse, Inc., Chicago, IL (US)

(*) Notice: Subject to any disclaimer, the term of this patent is extended or adjusted under 35 U.S.C. 154(b) by 115 days.

(21) Appl. No.: 16/158,047

(22) Filed: Oct. 11, 2018

(65) Prior Publication Data

US 2019/0199081 A1    Jun. 27, 2019

Related U.S. Application Data

(60) Provisional application No. 62/570,959, filed on Oct. 11, 2017.

(51) Int. Cl.
| | |
|---|---|
| *H02H 1/00* | (2006.01) |
| *G05B 1/01* | (2006.01) |
| *G01R 31/50* | (2020.01) |
| *G05B 23/02* | (2006.01) |
| *H02H 3/50* | (2006.01) |

(52) U.S. Cl.
CPC .......... *H02H 1/0015* (2013.01); *G01R 31/50* (2020.01); *G05B 1/01* (2013.01); *G05B 23/0235* (2013.01); *H02H 1/0092* (2013.01); *H02H 3/50* (2013.01)

(58) Field of Classification Search
CPC ... G01V 3/18; G01V 1/52; G01V 3/34; G01V 3/38; G01V 5/04; E21B 47/00; E21B 4/02; E21B 7/062
USPC ................ 324/346, 333, 334, 338, 339, 536
See application file for complete search history.

(56) References Cited

U.S. PATENT DOCUMENTS

| | | | |
|---|---|---|---|
| 4,072,200 A * | 2/1978 | Morris | E21B 47/0228 175/45 |
| 4,933,640 A * | 6/1990 | Kuckes | G01V 3/28 324/339 |
| 8,093,904 B2 | 1/2012 | Ohta et al. | |
| 2002/0062992 A1* | 5/2002 | Fredericks | G01V 1/52 175/40 |
| 2004/0143357 A1 | 7/2004 | Schwarm et al. | |
| 2005/0224478 A1 | 10/2005 | Stropki, Jr. et al. | |
| 2007/0085548 A1 | 4/2007 | Shinmoto et al. | |
| 2014/0320144 A1* | 10/2014 | Nakaya | B60L 58/12 324/434 |
| 2015/0372514 A1* | 12/2015 | Kobayashi | H02J 7/0014 320/134 |

(Continued)

OTHER PUBLICATIONS

International Search Report and Written Opinion for the International Patent Application No. PCT/US18/55440, dated Dec. 4, 2018.

*Primary Examiner* — Giovanni Astacio-Oquendo

(57) ABSTRACT

Arc fault detection devices and methods are described current between a source and a load is periodically measured. A variance of the periodically measured current values is derived and an arc fault can be detected abased on the derived variance. A variance interval signal can be incremented based on the derived variance increasing above a threshold level and a low pass filter arranged to detect an arc based on the incremented variance interval signal.

16 Claims, 9 Drawing Sheets

(56) References Cited

U.S. PATENT DOCUMENTS

2016/0003883 A1  1/2016  Chaintreuil et al.
2017/0264110 A1* 9/2017  Toya .................... H02J 7/0016

* cited by examiner

Storage Medium or
Non-Transitory Storage Medium
800

Processor Executable Instructions/
Machine Leaning Models
802
(334/460/500/700)

FIG. 8

ARC DETECTION BASED ON VARIANCE OF CURRENT FLOW

RELATED APPLICATIONS

This application claims the benefit of U.S. Provisional Application Ser. No. 62/570,959 filed Oct. 11, 2017, entitled "Arc Detection Based on Variance of Current Flow," which application is incorporated herein by reference in its entirety.

FIELD OF THE DISCLOSURE

The present disclosure generally relates to detecting current arcs and particularly to detecting current arcs in circuits.

BACKGROUND OF THE DISCLOSURE

Electrical distribution systems are found in many settings. For example, residential buildings, commercial buildings, industrial settings, automobiles, airplanes, ships, trains, etc. all typically have some type of electrical distribution system. Various faults in an electrical distribution system may lead to the occurrence of arcing, which carries a risk of fire and/or heat damage to the system.

Many automobiles currently use 12 Volt distribution systems. At this voltage, the risk of arcing is low. As such, many current automobiles do not include arc detection and/or arc protection devices. However, modern automobiles are increasing the voltage in the distribution system. For example, some modern automobiles are being designed with 48 Volt distribution systems. Furthermore, electric automobiles and hybrid automobiles often have electric distribution systems having voltages far greater than the common 12 Volt automobile distribution system. At these higher voltages, the potential for arcing and its associated risks is increased. Thus, there is a need for arc detection in automobiles.

BRIEF DESCRIPTION OF THE DRAWINGS

FIG. 8 illustrates a storage medium according to an exemplary embodiment.

DETAILED DESCRIPTION

Current arc detectors and methods of detecting current arcs are provided. The embodiments detailed herein are described in the context of an automobile electrical distribution system. However, this is done for convenience and clarity of presentation and not to be limiting. The current variance arc detectors detailed herein, and the associated methods can be provided to detect arcs in electrical distribution systems implemented in other areas, outside automobiles, such as, for example, avionics, aerospace, residential, commercial, or other settings where arc detection in electrical distribution systems is desired.

In general, an electrical distribution system can develop either a serial or a parallel arc. With serial arcing, the main current continues to flow through the supplied electric load and therefore does not increase beyond expected nominal current values, which makes detection of a serial arcing fault difficult to achieve. With parallel arcing, a new current path in parallel to the connected load forms. Depending on the impedance of the new current path, the arcing current can reach short circuit current values and be detected by conventional circuit protection systems. However, if the measured current does not reach defined threshold values, parallel arcing can remain unnoticed. Accordingly, many conventional devices are unable to detect arcing in high impedance systems as the arcing current is below a threshold value and/or cannot be distinguished from the normal operating condition currents.

Arcing is typically accompanied by the generation of disturbances and electromagnetic radiation with a broad frequency spectrum. Arc signatures related to these disturbances are used to detect arcs. However, complicating arc detection in automotive systems is the fact that operating conditions of many electric loads in an automotive power distribution system lead to diverse time-current curves. Many loads are switched on and off with different transient behaviors. Pulse-modulated controlled loads or switching converters create numerous disturbances in the distribution system. All these factors complicate arc detection as clear and consistent arc signatures are difficult to determine.

Another complication versus conventional arc detection systems is that arcing within a direct current (DC) circuit cannot be detected based on the periodicity of the voltage and current as is often done for arc detection within alternating current (AC) circuits.

Thus, there is a need for current arc detection devices and methods suitable for modern automotive electrical distribution systems and other such electrical distribution systems.

Figure 1:
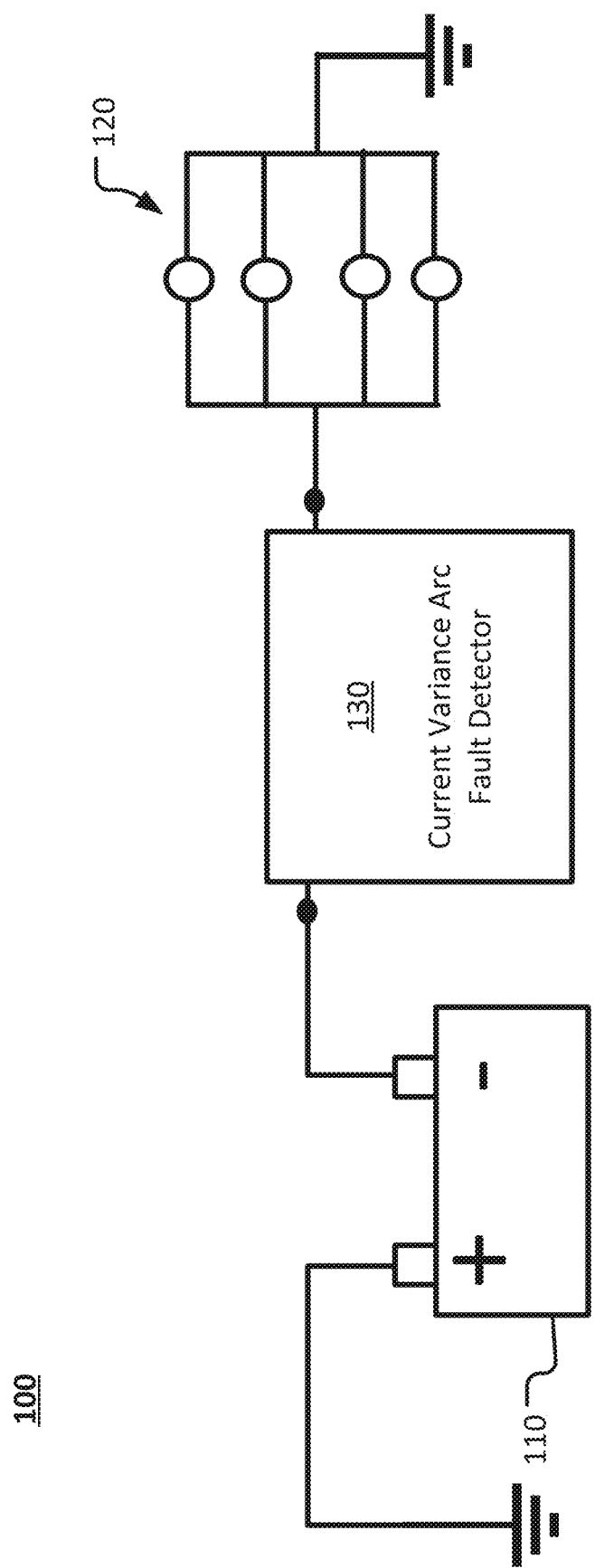
FIG. 1 illustrates a first example of an electrical distribution system including a current variance arc fault detector.

FIG. 1 illustrates an electrical distribution system 100 in accordance with an exemplary embodiment. The electrical distribution system 100 includes a battery 110 coupled to several loads 120. In general, the electrical distribution system 100 could be implemented in an automotive vehicle. The battery 110 may be a single battery or several batteries. For example, battery 110 could be a bank of batteries coupled in series, parallel, or some combination of series and parallel connection. The battery 110 may be any of a variety of types of batteries. For example, battery 110 could be a lead-acid based battery, a nickel-cadmium (NiCad) based battery, a nickel-metal hydride based battery, a lithium-ion (Li-ion) based battery, a Li-ion polymer based battery, a zinc-air based battery, or a molten-salt battery. Examples are not limited in this context.

The loads 120 could be any of a variety of loads arranged to draw power from the battery 110. That is, loads 120 could be DC loads in an electrical distribution system, such an automotive distribution system. For example, loads 120 could be any number or combination of motors, relays, pumps, safety devices, entertainment devices, or the like. Examples are not limited in this context.

The current variance arc fault detector 130 is coupled between the battery 110 and the loads 120. In general, the current variance arc fault detector 130 is arranged to detect current arc faults between the battery 110 and one (or more) of the loads 120. Additionally, the current variance arc fault detector 130 is arranged to detect current arc faults between one (or more) of the loads 120 and ground. As used herein, a current arc fault is an electrical breakdown of the resistance of air resulting in an electric arc. Arc faults can occur where there is sufficient voltage in the electrical distribution system 100 and a path to a lower voltage or ground. Examples of such arc faults are serial arc faults, parallel arc faults and ground arc faults.

The current variance arc fault detector 130 is configured to detect, based on a variance of periodic current measurements, an arc fault in the electrical distribution system 100. The current variance arc fault detector 130 can repeatedly measure a current flow between battery 110 and loads 120, derive a variance between the values of the repeatedly measured current flow values, and determine whether a current arc fault is present between the battery 110 and one (or more) of the loads 120 or between one (or more) of the loads 120 and ground based on the derived variance.

In some examples, current variance arc fault detector 130 could be arranged to repeatedly measure current between the battery and several of the loads 120 to determine the presence of an arc fault on any one of the load branches within the electrical distribution system 100.

Figure 2:
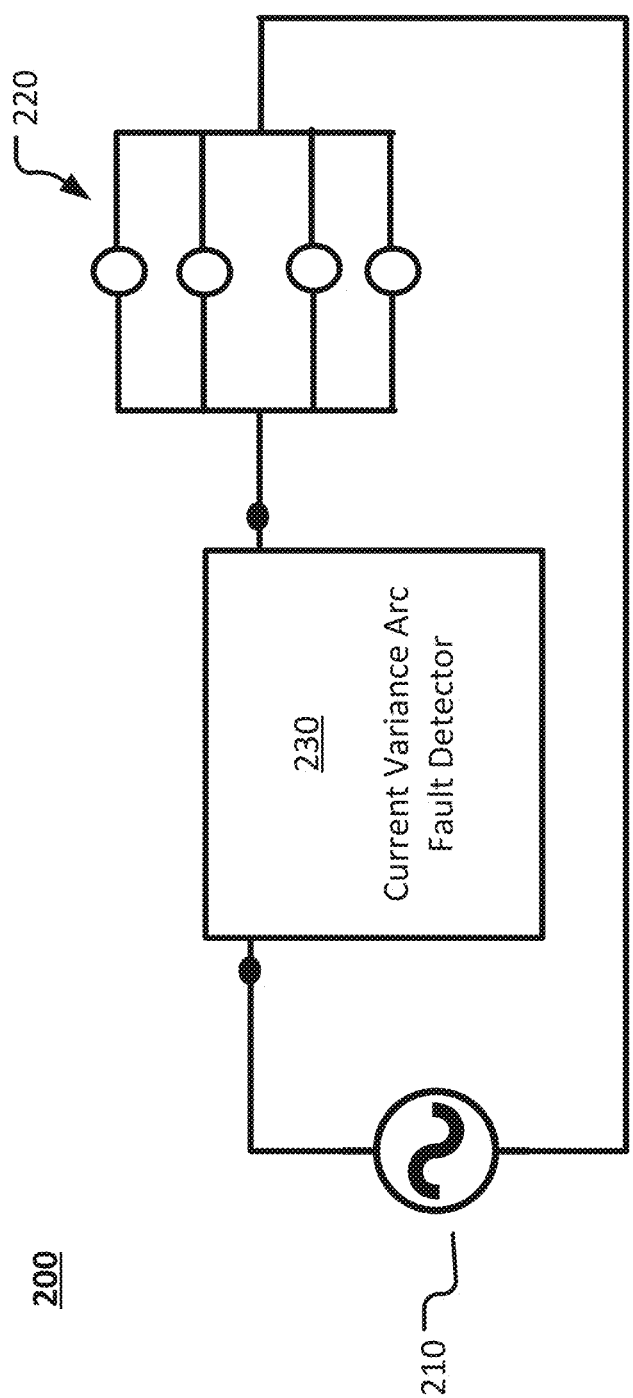
FIG. 2 illustrates a second example of an electrical distribution system including a current variance arc fault detector.

FIG. 2 illustrates an electrical distribution system 200 in accordance with an exemplary embodiment. The electrical distribution system 200 includes a source 210 coupled to several loads 220. In this example, the source 210 is an alternating current (AC) power source. The source 210 could be a single-phase source, or a multiple (e.g., 3, or the like) phase source. In general, the electrical distribution system 200 could be implemented in any of a variety of settings, such as, for example, industrial, commercial, residential, transportations, or the like.

The loads 220 could be any of a variety of loads arranged to draw power from the source 210. In general, loads 220 could be AC loads in an electrical distribution system. For example, loads 220 could be any number or combination of motors, relays, pumps, safety devices, entertainment devices, or the like. Examples are not limited in this context.

The current variance arc fault detector 230 is coupled between the source 210 and the loads 220. In general, the current variance arc fault detector 230 is arranged to detect current arc faults between the source 210 and one (or more) of the loads 220. As an example, arc faults within distribution system 200 could occur between phases of source 210, between a phase of source 210 and ground, or between a phase of source 210 and neutral. Furthermore, it is noted, arc faults could occur between loads 220 or between one (or more) loads 220 and ground. For example, an arc fault could develop within a panel in which loads 220 are coupled to source 210. The current variance arc fault detector 230 may be arranged to detect any such arc faults.

The current variance arc fault detector 230 is configured to detect, based on a variance of periodic current measurements, an arc fault in the electrical distribution system 200. The current variance arc fault detector 230 can repeatedly measure a current flow between source 210 and loads 220, derive a variance between the values of the repeatedly measured current flow values, and determine whether a current arc fault is present between the source 210 and one of the loads 220 or between one of the loads 220 and ground based on the derived variance.

In some examples, current variance arc fault detector 230 could be arranged to repeatedly measure current between the source 210 and several of the loads 220 to determine the presence of an arc fault on any one of the load branches within the electrical distribution system 200.

Figure 3:
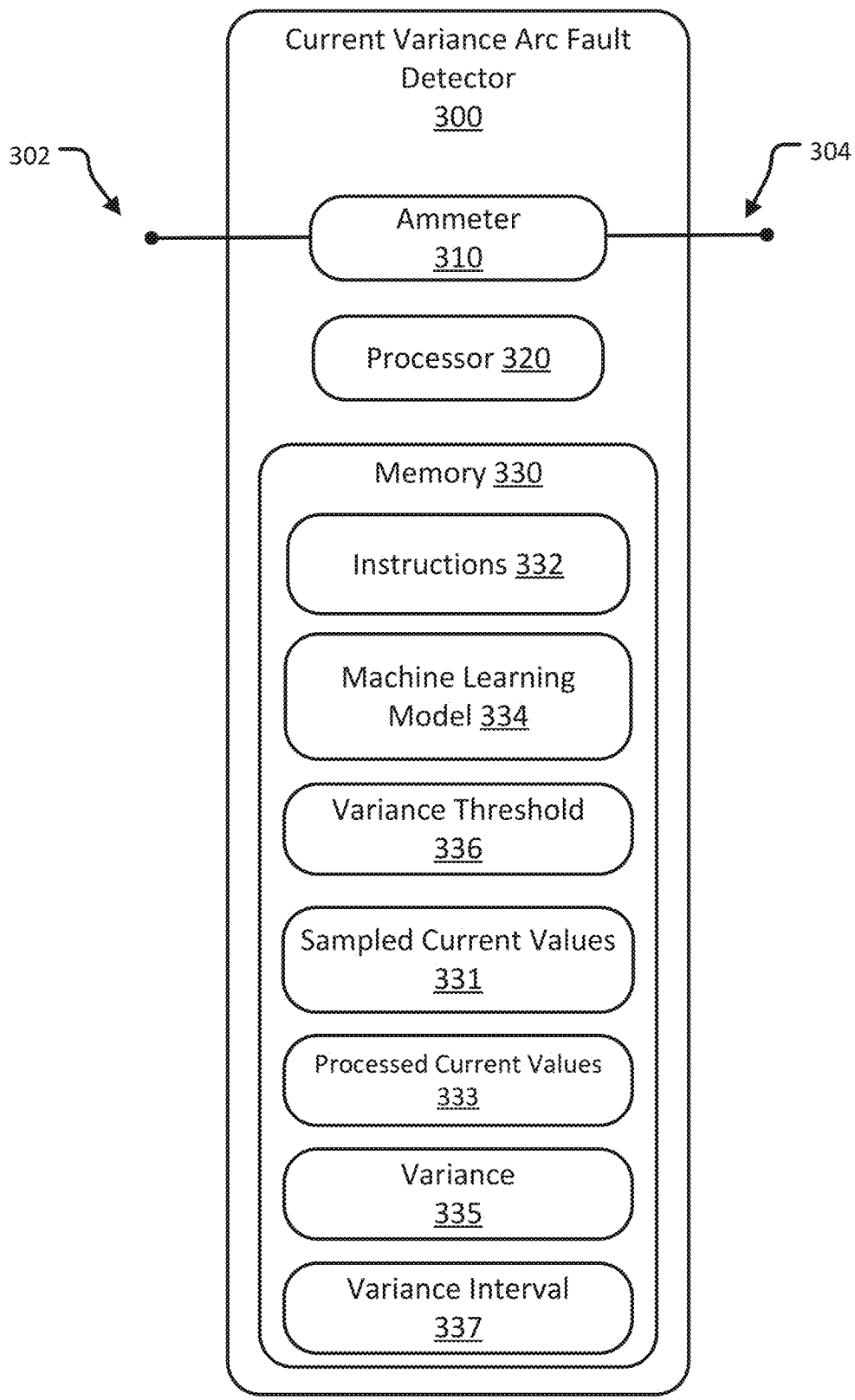
FIG. 3 illustrates a first example of a current variance arc fault detector.
Figure 4:
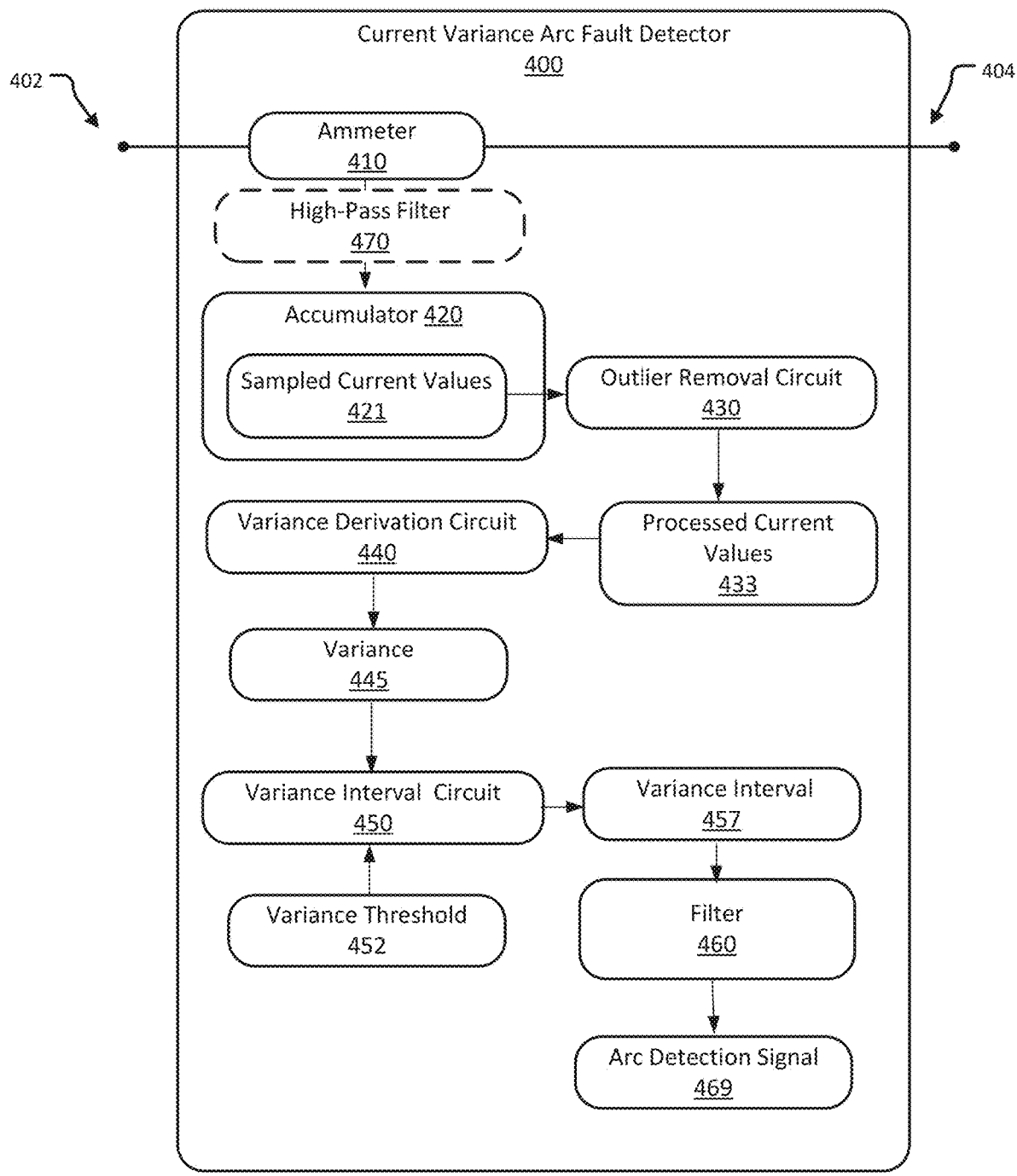
FIG. 4 illustrates a second example of a current variance arc fault detector.

FIGS. 3-4 depict example embodiments of current variance arc fault detectors 300 and 400, respectively. Current variance arc fault detectors 300 and 400 could be implemented in the electrical distribution system 100 and/or 200, for example, as current variance arc fault detector 130, 230, etc. It is noted, however, that current variance arc fault detectors 300 and 400 are described with reference to the electrical distribution system 100 of FIG. 1 for purposes of convenience and not limitation. Of note, the current variance arc fault detectors 300 and 400 could be implemented in an electrical distribution system different from the electrical distribution system 100 depicted in FIG. 1, such as, for example, the distribution system 200 of FIG. 2. As such, reference to a battery, DC source, or other type of feature from distribution system 100 is done for example only and not to be limiting.

Turning more particularly to FIG. 3, the current variance arc fault detector 300 is depicted. Current variance arc fault detector 300 includes terminals 302 and 304, which can couple to a source and load, respectively, in an electrical distribution system. For example, terminal 302 could couple to battery 110 while terminal 304 can couple to one (or more) of loads 120 from the electrical distribution system 100 of FIG. 1. Current variance arc fault detector 300 includes an ammeter 310 coupled in series between terminals 302 and 304. Ammeter 310 is arranged to measure a current flowing between terminals 302 and 304. Thus, for example, ammeter 310 can measure a current flowing between a source and a load in an electrical distribution system, such as, current flowing between battery 110 and one (or more) of loads 120. In some examples, ammeter 210 could be a hall effect sensor, a shunt, or a rogowski coil. However, other current sensor devices and/or circuits arranged to measure a current could be implemented without departing from the scope of the claimed subject matter.

Current variance arc detector 300 further includes processor 320 and a memory 330. Processor 320 can be any of a variety of processors, such as, for example, a microprocessor, a general-purpose processor, an application specific integrated circuit, or a field programmable gate array. Memory 330 can be any of a variety of computer-readable mediums arranged to store, in a non-transitory manner, instructions 332, machine learning model 334, and a variance threshold 336.

Instructions 332 can comprise instructions, executable by processor 320, which when executed by processor 320 cause current variance arc fault detector 300 to implement any of a variety of actions as described herein. Instructions 332 can be firmware for current variance arc fault detector 300 arranged to enable current variance arc fault detector 300 to detect an arc fault as detailed herein.

Machine learning model 334 can be a machine-leaning model, executable by processor 320, to cause current variance arc fault detector 300 to detect an arc fault as detailed herein. For example, machine learning model 334 could be a neural network, a fuzzy logic model, convolutional network, or other such model trained to detect arc faults as detailed herein.

During operation, processor 320, in executing instructions 332, can cause ammeter 310 to repeatedly measure current flowing between terminals 302 and 304. In some examples, processor 320, in executing instructions 332, can cause ammeter 310 to periodically measure current flowing between terminals 302 and 304. As a specific example, processor 320, in executing instructions 332, can cause ammeter 310 to measure current flowing between terminals 302 and 304 at a sampling rate between 0.1 and 5 mega-samples per second (MS/s). In some implementations, processor 320, in executing instructions 332, can cause ammeter 310 to measure current flowing between terminals 302 and 304 at a sampling rate of 1 MS/s. Processor 320, in executing instructions 332, can store, in memory 330, the repeatedly (or periodically) measured current values as sampled current values 331.

Processor 320, in executing instructions 332, can identify and remove outliers from the sampled current values. With some implementations, processor 320, in executing instructions 332, identifies and removes outliers from a portion of the sampled current values, such as, a range of recent current values (e.g., 250 to 100,000, or the like). In a specific example, processor 320, in executing instructions 332, can process the most recent 1,000 samples from sampled current values and can identify and remove outliers from the 1,000 most recent samples. In some embodiments, outliers are identified and removed based on a confidence interval of twice the standard deviation within the data set (e.g., most recent 1,000 sampled current values 331, or the like). The processor 320, in executing instructions 332, can store, in memory 330, the subset of current values with outliers removed as processed current values 333.

In some examples, processor 320, in executing instructions 332, can pre-filter sampled current values 331. Processor 320, in executing instructions 332 could apply filtering, such as, high pass filtering, to sampled current values 331 before and/or in conjunction with identifying and removing outliers as described above. With a specific example, processor 320, in executing instructions 332 could apply a high pass filter with a cut-off frequency of between 40 kilo Hertz (kHz) and 200 kHz to sampled current values 331.

Processor 320, in executing instructions 332, can derive, calculate, or determine, a variance of the processed current values 333 and can store, in memory 330, the derived variance as variance 335. Processor 320, in executing instructions 332, can derive the variance as the sum of the squared distances between each value and the mean of the values, or:

$$\sigma^2 = \frac{\sum (X - \mu)^2}{N - 1}$$

where X is the values of processed current values 333, μ is the mean of the processed current values 333, and N is the number of values in the set of processed current values 333. Processor 320, in executing instructions 332, can determine whether the variance 335 exceeds variance threshold 336. Processor 320, in executing instructions 332, increment a variance interval 337 based on a determination that the variance 335 exceeds the variance threshold 336. In some examples, variance interval 337 is incremented 0.001 each cycle that processor 320 determines the variance 335 exceeds the variance threshold 336. Processor 320, in executing instructions 332, can reset variance interval 337 to zero based on a determination that that variance 335 does not exceed the variance threshold 336. With some examples, the variance threshold 336 can be a maximum level of the variance observed during normal operation of the monitored load branch where arcing is not present. Said differently, the variance threshold 336 may be determined in advance and programmed based on the type and/or specific circuit to be monitored for arcing.

Processor 320, in executing machine learning model 334, can determine whether an arc fault exists in the electrical distribution line corresponding to terminals 302 and 304 based on the variance interval 337. For example, processor 320, in executing machine learning model 334, can detect an arc fault between battery 110 and one of loads 120 (or between load(s) 120 and ground) based on the determined variance interval 337. This is described in greater detail below, for example, with reference to FIG. 5 and FIGS. 6A-6D.

Turning more particularly to FIG. 4, the current variance arc fault detector 400 is depicted. Current variance arc fault detector 400 includes terminals 402 and 404, which can couple to a source and load, respectively, in an electrical distribution system. For example, terminal 402 could couple to battery 110 while terminal 404 can couple to one (or more) of loads 120 from the electrical distribution system 100 of FIG. 1. Current variance arc fault detector 400 includes an ammeter 410 coupled in series between terminals 402 and 404. Ammeter 410 is arranged to measure a current flowing between terminals 402 and 404. Thus, ammeter 410 can measure a current flowing between a source and a load in an electrical distribution system, such as, current flowing between battery 110 and one (or more) of loads 120. In some examples, ammeter 410 could be a hall effect sensor, a shunt, or a rogowski coil.

Current variance arc fault detector 400 additionally includes an accumulator 420, an outlier removal circuit 430, a variance derivation circuit 440, a variance interval circuit 450 and a filter 460. Furthermore, current variance arc fault detector 400 could include a memory (e.g., registers, flash, random access memory, or the like) arranged to store values as described herein. However, memory is not depicted within this figure for purposes of convenience.

Accumulator 420 is arranged to accumulate sampled current values 421. Sampled current values 421 can be current values measured by ammeter 410 on a repeating basis. The repeating basis can be periodic. For example, accumulator 420 can be arranged to store measured current values at a sampling rate of between 0.1 and 5 mega-samples per second (MS/s). In some implementations, accumulator 420 can be arranged to store measured current values at a sampling rate of 1 MS/s. Accumulator 420 can store the measured current values as sampled current values 421. With some examples, accumulator 420 can be arranged to store a specified number of measured current values, such as, for example, 250 to 100,000. In a specific example, accumulator 420 can store 1,000 measured current values as sampled current values 421. Accumulator 420 could be arranged with registers or a buffer to store measured current values. For example, accumulator 420 could include a first in first out (FIFO) buffer arranged to store the most recent (e.g., 1,000, or the like) current values measured by ammeter 410.

Current variance arc fault detector 400 could optionally include a high-pass filter 470 arranged between ammeter 410 and accumulator 420. High-pass filter 470 could be, for example, a butterworth filter (or the like) arranged to with a cut-off frequency of between 40 kHz and 200 kHz. High-pass filter 470 could be implemented to filter raw current values measured by ammeter 410 and only pass current values above the cut-off frequency to accumulator 420.

Outlier removal circuit 430 is arranged to identify and remove outliers from sampled current values 421. In some embodiments, outlier removal circuit 430 removes outliers based on a confidence interval of twice the standard deviation within the data set (e.g., sampled current values 421)

and stores (e.g., in memory, or the like) the sampled current values with outliers removed as processed current values 433. In some examples, outlier removal circuit 430 can be a logical circuit comprised of gates, transistors, and/or registers arranged to average sampled current values and remove ones of the sampled current values outside a defined limit of the average. As another example, outlier removal circuit can 430 be an FPGA arranged to generate processed current values 433 from sampled current values 421 as discussed above.

Variance derivation circuit 440 can derive, calculate, or determine, a variance of the processed current values 433 and can store the derived variance as variance 445. Variance derivation circuit 440 can derive the variance as the sum of the squared distances between each value and the mean of the values, or:

$$\sigma^2 = \frac{\sum (X - \mu)^2}{N - 1}$$

where X is the values of processed current values 433, μ is the mean of the processed current values 433, and N is the number of values in the set of processed current values 433. In some examples, variance derivation circuit 440 can be a logical circuit comprised of gates, transistors, and/or registers arranged to determine a variance between the processed current values and store (e.g., in memory, or the like) the derived variance as variance 445. As another example, variance deviation circuit can 440 be an FPGA arranged to generate variance 445 from processed current values 433 as discussed above.

Variance interval circuit 450 can increment a variance interval 457 based on a determination that the variance 445 exceeds a variance threshold 452. In some examples, variance interval 457 is incremented 0.001 each cycle that variance interval circuit 450 determines variance 445 exceeds variance threshold 452. Additionally, variance interval circuit 450 can reset variance interval 457 to zero based on a determination that variance 445 does not exceeds variance threshold 452. With some examples, the variance threshold 452 can be a maximum level of the variance observed during normal operation of the monitored load branch where arcing is not present. Said differently, the variance threshold 452 may be determined in advance and programmed based on the type and/or specific circuit to be monitored for arcing.

Filter 460 can output arc detection signal 469 based on an input of variance interval 457. In some examples, filter 460 can be a machine learning model (e.g., neural network, convolutional network, fuzzy logic model, or the like) arranged to operate as a low pass filter. As another example, filter 460 can be a low pass filter tuned to output arc detection signal 469 from variance interval 457.

Figure 5:
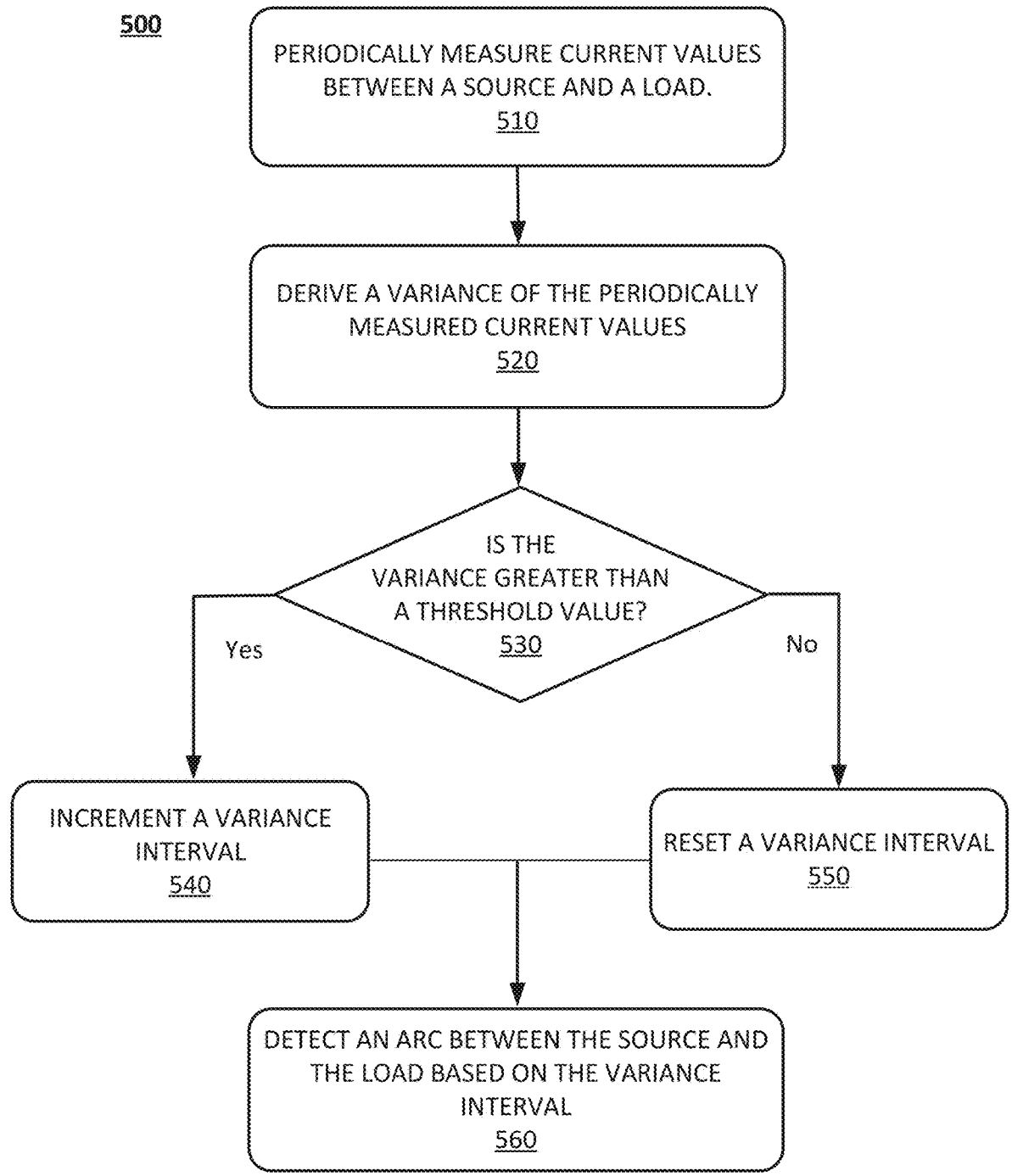
FIG. 5 illustrates a logic flow to detect arc faults based on current variance.

FIG. 5 depicts a logic flow 500, which can be implemented by the current variance arc fault detectors described herein. For example, logic flow 500 can be implemented by current variance arc fault detector 130, current variance arc fault detector 230, current variance arc fault detector 300 and/or current variance arc fault detector 400. Additionally, logic flow 500 could be implemented by a current variance arc fault detector different than those described herein without departing from the sprit and scope of the disclosure.

Figure 6A:
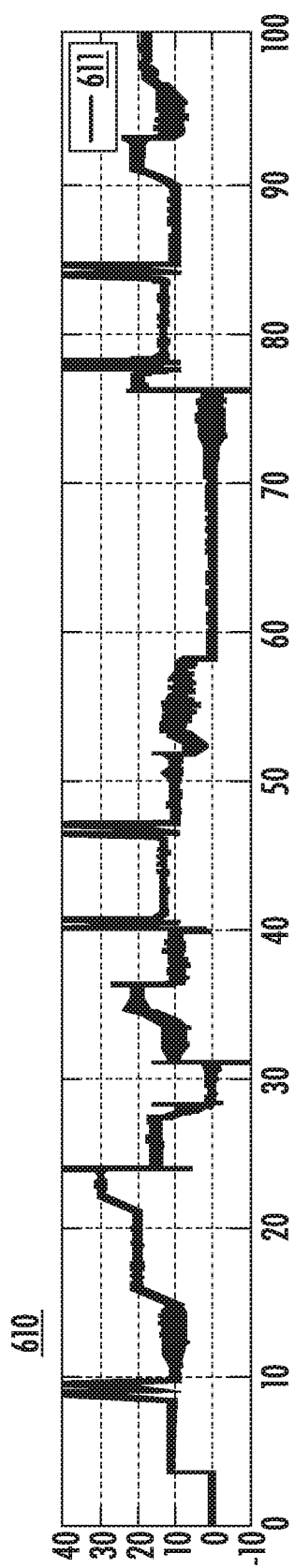
FIGS. 6A-6D illustrate example time curves for measured and/or derived metrics associated with detecting arc faults based on current variance.
Figure 6B:
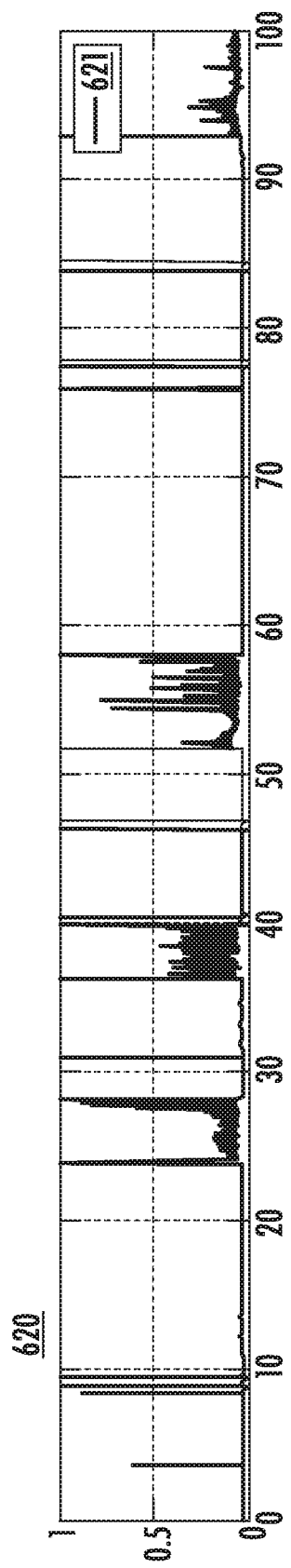
Figure 6C:
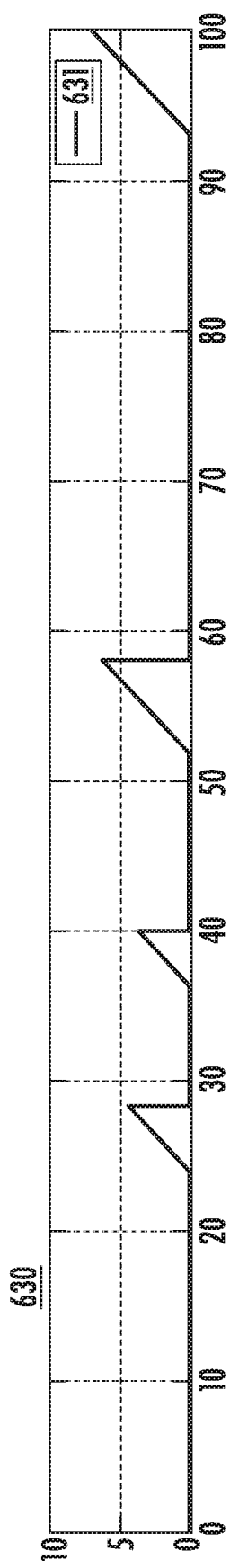
Figure 6D:
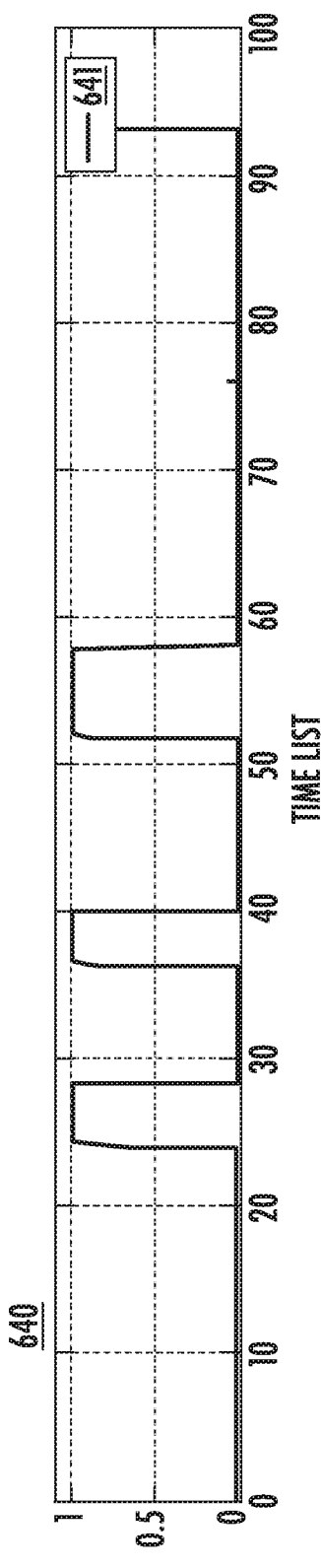

Logic flow 500 is described with reference to current variance arc fault detector 330 and additionally with reference to FIGS. 6A-6D. FIGS. 6A-6D depict waveforms, or time curves, of several signals which may be measured and/or determined according to the present disclosure. For example, FIG. 6A depicts a time curve 610 of measured load current, FIG. 6B depicts a time curve 620 of derived variance, FIG. 6C depicts a time curve 630 of a determined variance interval, and FIG. 6D depicts a time curve 640 of an arc detection signal.

Logic flow 500 may begin with block 510. At block 510 "periodically measure current values between a source and a load" current values between a source and a load are periodically measured. For example, processor 320, in executing instructions 332, can cause ammeter 310 to periodically measure current values between a source (e.g., battery 110) and a load (e.g., load 120). These periodically measured current values can be stored as sampled current values 331. FIG. 6A depicts an example time curve 610 illustrating periodically measured current values 611 between the source and the load.

Continuing to block 520 "derive a variance of the periodically measured current values" a variance of the periodically measured current values can be derived. For example, processor 320, in executing instructions 332, can derive a variance of the sampled current values, 331, or the values measured at block 510. FIG. 6B depicts an example time curve 620 illustrating the derived variance 621 of the periodically measured current values 611 between the source and the load.

Continuing to decision block 530 "is the variance greater than a threshold variance?" it can be determined whether the variance is greater than a threshold variance. For example, processor 320, in executing instructions 332, can determine whether the variance derived at block 520 is greater than a threshold variance value. Logic flow 500 can continue from decision block 530 to either block 540 or block 550. At block 540 "increment a variance interval" processor 320, in executing instructions 332, can increment a variance interval based on a determination that the derived variance is greater than the threshold variance. Conversely, at block 550 "reset a variance interval" processor 320, in executing instructions 332, can reset the variance interval based on a determination that the derived variance is not greater than the variance threshold. FIG. 6C depicts an example time curve 630 illustrating a variance interval signal 631 corresponding to an incremented variance interval 621, which is reset where the derived variance is not greater than a threshold. As depicted, the variance interval signal 631 has the appearance of a "saw tooth" signal where the "teeth" of the signal may be larger in the presence of arcing.

Logic flow 500 continues from both block 540 and block 550 to block 560 "detect an arc between the source and the load based on the variance interval" an arc fault can be detected based on the variance interval. Processor 320, in executing machine learning model 334, can detect an arc fault based on the variance interval. FIG. 6D depicts an example time curve 640 illustrating an arc fault signal 641 generated from the variance interval 631. Said differently, the time curve 640 can correspond to a signal generated by inputting the variance interval 631 of the time curve 630 into a machine learning model (e.g., a neural network, or the like) to detect the presence of arcing based on the derived variance and an incremented variance interval as detailed herein.

Logic flow 500 may further include blocks to extinguish the detected arc. For example, logic flow 500 could include a block to cause a switch or arc protection device to open thereby shunting the flow of current and extinguishing the detected arc.

Figure 7:
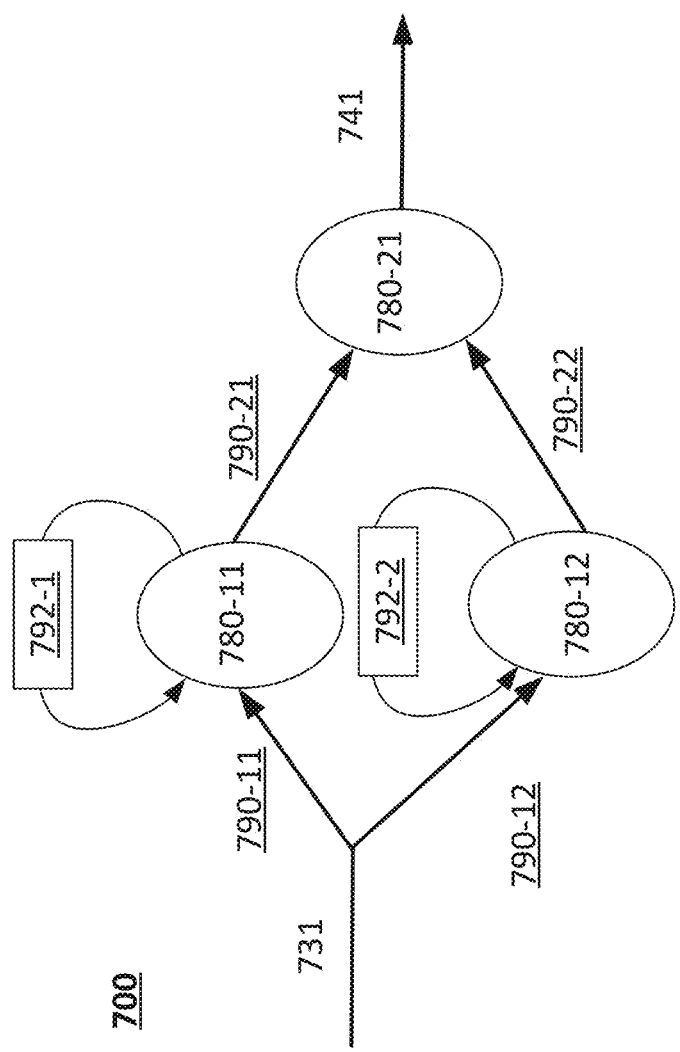
FIG. 7 illustrates an example machine learning model to detect arc faults from current variance.

FIG. 7 depicts an example machine learning model 700 according to the present disclosure. The machine learning model 700 can be implemented as the machine learning model 334, the filter 460, or the like. That is, the machine learning model 700 can be arranged to detect or output a signal to detect an arc fault based on a variance interval (e.g., variance interval 337, variance interval 457, or the like.) The machine learning model 700 depicted in this figure is a recurrent neural network having a single hidden layer. It is noted, that the machine learning model 700 could be a different type of neural network or could have a different arrangement, such as, different number of hidden layer or different number of nodes, etc. In general, the machine learning model 700 takes as input a variance interval 731 and outputs a fault signal 741. The input 731 is processed at nodes 780 connected via connections 790. At each connection 790, the input to the connection is scaled by a weight (W) and then processed by an activation function at the node. A number of activation functions can be utilized, and an exhaustive list is not provided here. Furthermore, recurrence of prior inputs is accounted for by the loops 792. Accordingly, inputs 731 are input to the machine learning model 700. For example, let X represent a time series of variance intervals X for times T. The variance intervals 731 $X_t$ can be fed into the machine learning model 700, which is scaled by connections 790-11 and 790-12 and then processed by nodes 780-11 and 780-12. Nodes 780-11 and 780-12 also receive as input the output from each respective node at the prior time (e.g., output of the node resulting from input $X_{t-1}$). The output from nodes 780-11 and 780-12 are scaled by connections 790-12 and 790-22 and then processed by node 780-21. The output from node 780-21 is the fault signal 741.

The weights W at which each connection 790 scales is learned during a training phase of the machine learning model 700. The machine learning model 700 may be trained, for example, using conventional machine learning training techniques from a data set including variance interval signals corresponding to known arc faults, or the like. Said differently, the machine learning model 700 can be iterated until the weights in the nodes converge upon an acceptable solution to detect arc flashing as detailed herein. As such, the machine learning model 700 may be "trained" to detect (or output a fault signal 741) indicating the presence of an arc fault based on variance interval 731 signals during operation of a current variance arc fault detector as detailed herein.

FIG. 8 illustrates an embodiment of a storage medium 800. The storage medium 800 may comprise an article of manufacture. In some examples, the storage medium 800 may include any non-transitory computer readable medium or machine readable medium, such as an optical, magnetic or semiconductor storage. The storage medium 800 may store various types of processor executable instructions or machine learning models 802. For example, storage medium 800 can be coupled to processor(s) described herein (e.g., processor 320, etc.) while such processor(s) can be arranged to execute instructions and/or machine learning models. As an example, the storage medium 800 may store various types of computer executable instructions to implement logic flow 500. As another example, the storage medium 800 may store a description or values representative of the machine learning model 334. As another example, the storage medium 800 may store a description or values representative of the filter 460 (e.g., connection weights, nodes, activations functions, etc.) As another example, the storage medium 800 may store a description or values representative of the machine learning model 700. Additionally, the storage medium 800 may store computer executable instructions to execute the machine learning models or filter.

Examples of a computer readable or machine-readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

While current variance arc fault detectors and associated methods of detecting arc faults based on current variance have been described with reference to certain embodiments, it will be understood by those skilled in the art that various changes may be made, and equivalents may be substituted without departing from the spirit and scope of the claims of the application. Other modifications may be made to adapt particular situations or materials to the teachings disclosed above without departing from the scope of the claims.

We claim:

1. An apparatus comprising:
   a processor; and
   memory comprising instructions, which when executed by the processor cause the processor to:
   receive, from a current sensor, a plurality of sensed current values;
   derive a variance between the plurality of sensed current values; and
   generate a signal indicative of an arc fault based in part on the variance.

2. The apparatus of claim 1, the memory comprising instructions that when executed by the processor cause the processor to:
   determine a mean of the plurality of sensed current values;
   sum the square of a distances between each of the plurality of values and the mean; and
   derive the variance based in part on the sum.

3. The apparatus of claim 1, the memory comprising instructions that when executed by the processor cause the processor to remove at least one outlier from the plurality of sensed current values, filter the plurality of sensed current values, or both remove at least one outlier from the plurality of sensed current values and filter the plurality of sensed current vales.

4. The apparatus of claim 3, the memory comprising instructions that when executed by the processor cause the processor to remove the at least one outlier from the plurality of sensed current values based in part on a standard deviation across the plurality of sensed current values.

5. The apparatus of claim 3, the memory comprising instructions that when executed by the processor cause the processor to filter the plurality of sensed current values based on a high pass filter with a cut-off frequency of between 40 kilo Hertz (kHz) and 200 kHz.

6. The apparatus of claim 1, the memory comprising instructions that when executed by the processor cause the processor to:
   determine whether the variance is greater than a threshold value;
   increment a variance interval based on a determination that the variance is greater than the threshold value; and
   generate the signal indicative of the arc fault based in part on the variance interval.

7. The apparatus of claim 6, the memory comprising instructions that when executed by the processor cause the processor to generate the signal indicative of the arc fault based on a machine learning model, where an input to the machine learning model is the variance interval and an output from the machine learning model is the signal.

8. The apparatus of claim 7, the machine learning model a recurrent neural network.

9. The apparatus of claim 6, the memory comprising instructions that when executed by the processor cause the processor to reset the variance interval based on a determination that the variance is not greater than the threshold value.

10. A system comprising:
a current sensor to couple to a source and at least one load;
logic, at least a portion of which is in hardware, the logic to:
receive, from the current sensor, a plurality of current values corresponding to current between the source and the at least one load; derive a variance between the plurality of sensed current values; and
generate a signal indicative of an arc fault based in part on the variance.

11. The system of claim 10, the logic to:
determine a mean of the plurality of sensed current values;
sum a square of a distance between each of the plurality of values and the mean; and
derive the variance based in part on the sum.

12. The system of claim 10, the logic to remove at least one outlier from the plurality of sensed current values, filter the plurality of sensed current values, or both remove at least one outlier from the plurality of sensed current values and filter the plurality of sensed current vales, wherein the logic to remove the at least one outlier from the plurality of sensed current values based in part on a standard deviation across the plurality of sensed current values and the logic to filter the plurality of sensed current values based on a high pass filter with a cut-off frequency of between 40 kilo Hertz (kHz) and 200 kHz.

13. The system of claim 10, the logic to:
determine whether the variance is greater than a threshold value;
increment a variance interval based on a determination that the variance is greater than the threshold value;
reset the variance interval based on a determination that the variance is not greater than the threshold value; and
generate the signal indicative of the arc fault based in part on the variance interval.

14. The system of claim 13, the logic to generate the signal indicative of the arc fault based on a machine learning model, where an input to the machine learning model is the variance interval and an output from the machine learning model is the signal.

15. The system of claim 14, the machine learning model a recurrent neural network.

16. The system of claim 10, the source a direct current source in a 48 Volt automotive distribution system.

* * * * *